United States Patent [19]
Matsunaga

[11] Patent Number: 5,389,148
[45] Date of Patent: Feb. 14, 1995

[54] SPRAY APPARATUS UTILIZING POROUS SHEET

[75] Inventor: Masafumi Matsunaga, Yokohama, Japan

[73] Assignee: Nordson Corporation, Ohio

[21] Appl. No.: 10,430

[22] Filed: Jan. 28, 1993

[51] Int. Cl.⁶ .................... B05C 5/00; B05C 11/00; B05B 3/00
[52] U.S. Cl. .................... 118/300; 118/63; 118/323; 118/301; 118/317; 118/100; 101/119; 239/97; 239/DIG. 23; 68/205 R; 427/348; 427/421
[58] Field of Search .............. 118/323, 301, 300, 325, 118/504, 103, 105, 63, 317, 100; 239/97, DIG. 23; 101/119, 120, 123; 68/205 R; 427/348, 349, 421

[56] References Cited

U.S. PATENT DOCUMENTS

| | | | |
|---|---|---|---|
| 3,158,503 | 11/1964 | Young | 118/63 |
| 3,384,931 | 5/1968 | Cochran et al. | 101/123 |
| 4,671,205 | 6/1987 | Billeter | 118/323 |
| 4,854,230 | 8/1989 | Niki et al. | 101/123 |
| 5,197,384 | 3/1993 | Yawata et al. | 101/123 |

FOREIGN PATENT DOCUMENTS 4-35767  2/1992  Japan.

Primary Examiner—W. Gary Jones
Assistant Examiner—Steven P. Griffin
Attorney, Agent, or Firm—Wood, Herron & Evans

[57] ABSTRACT

A spray method and apparatus for uniformly coating a surface with a high degree of efficiency includes filling the pores of a porous sheet with a liquid and then directing compressed fluid from a nozzle into the sheet from one side to spray the liquid onto a surface spaced from an opposite side. Because the total volume of the pores is known, the volume of the sprayed liquid is also known. Moving the nozzle relative to the sheet and the substrate enables the entire surface to be uniformly coated. The size and distribution of the pores on the sheet define the distribution of the liquid sprayed onto the substrate. The coating may be a thick or a thin film of uniform thickness, or may even comprise a recognizable pattern.

4 Claims, 3 Drawing Sheets

SPRAY APPARATUS UTILIZING POROUS SHEET

FIELD OF THE INVENTION

This invention relates to a method and apparatus for spraying a liquid in a fixed quantity to achieve uniform coating of a substrate.

BACKGROUND OF THE INVENTION

Presently, there are numerous methods used to coat or apply a liquid onto a surface. These methods include traditional brush painting, dipping, roller-type transfer, spraying, extruding and film application. Roller type transfer application is still popular, but this method invariably results in some nonuniformity in coating and residue on the roller. The spraying method is perhaps the most frequently used of these methods, due to its simplicity and the ease in achieving an applied film which is relatively thin and uniform in thickness.

However, even spraying is not perfect. Generally, spray coating produces some uneven film thickness from the center of the spray pattern to the outer portions of the pattern. Additionally, because of the high pressures used, spraying produces an environmental problem and is not very efficient, due to the high number of airborne particles or droplets which deflect and disperse off of the surface to be coated.

It is an objective of this invention to improve the uniformity in thickness of a liquid coating applied to a surface.

It is another objective of the invention to more efficiently spray coat a surface by reducing dispersion.

The above-stated objectives are achieved by filling the pores of a porous sheet with a liquid and then pushing the liquid out of the pores by pressure to transfer the liquid onto the surface to be coated. Preferably, the liquid is pushed out of the pores by spraying a compressed fluid.

By wiping the excess liquid from the sheet prior to transfer, only a volume of liquid equal to the volume of the pores will remain. If the volume of the pores is known, the volume of the liquid transferred to the surface will be known with a high degree of accuracy.

Variations of this method include arranging the size and/or the distribution pattern of the pores in the sheet to form a recognizable pattern. This technique can be used for printing to achieve a shading effect normally produced by silk screening. Also, the pores may be tapered in the direction of the surface to be coated.

This invention makes it possible to spray a film evenly on an entire surface to be coated, regardless of the desired thickness of the coating, while also eliminating worries about dispersion and/or diffusion of the sprayed material. The liquid transferred to the surface is uniform if all the pores are identical in size and evenly distributed on the sheet. The width and length of the spray pattern are also easy to control, because they are determined by the dimensions of the sheet.

By locating a compressed air nozzle in contact with one side of the sheet and spraying compressed air into the sheet, the liquid inside the pores will be sprayed toward the surface to be coated, which is located on the opposite side of the sheet. Parallel movement of the nozzle with respect to the sheet and the surface will expel all of the liquid held in the pores of the sheet. The thickness or density of the sprayed film may be controlled by also moving the surface to be coated, relative to the sheet, but at a different speed than the nozzle.

According to another variation, if the nozzle is moved relative to a screen and a surface which are fixed in parallel position, and the flow of the compressed air to the nozzle is controlled, i.e., turned off and on according to a desired sequence, the liquid can be sprayed onto the surface to form a pattern. If it is desired to reduce the stickiness or adhesion of the liquid, the compressed air may be heated. If the liquid includes a solvent subject to evaporation, the solvent may be added to the compressed air.

The present invention contemplates three preferred apparatus for performing the above-described spraying methods, wherein the porous sheet may be flat, in the form of an endless belt or in the form of a hollow cylinder. Each of these embodiments automates the process steps of filling the porous sheet with a liquid, wiping excess liquid from the sheet and spraying the sheet to transfer the liquid to a surface. Each of these embodiments also facilitates relative movement between the nozzle and the sheet and the surface to be coated.

These and other features of the invention will be more readily understood in view of the following detailed description and the drawings.

BRIEF DESCRIPTION OF THE DRAWINGS

FIG. 1A is a cross-sectional view which depicts a porous sheet used in accordance with this invention.

FIG. 1B is a cross-sectional view, similar to FIG. 1A, after the porous sheet has been filled with liquid.

FIG. 1C is a cross-sectional view, similar to FIGS. 1A and 1B, after excess liquid has been scraped from the opposing sides of the porous sheet.

FIG. 1D is a cross-sectional view, similar to FIGS. 1A, 1B and 1C, depicting transfer of the liquid from the pores of the porous sheet to the coating surface.

FIG. 1E is a cross-sectional view, similar to FIGS. 1A, 1B, 1C and 1D, of the surface after liquid coating thereon.

DETAILED DESCRIPTION OF THE DRAWINGS

Figure 1A:
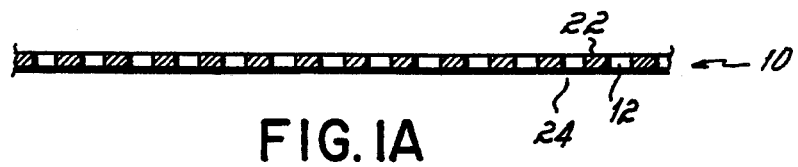
FIGS. 1A–1E, sequentially depict a series of method steps for spraying a liquid in accordance with one method of this invention.

FIG. 1A depicts a sheet 10 having a plurality of penetration type porous holes 12 formed therethrough. Preferably, the sheet 10 is metal and has a thickness of about 100 microns. The sheet 10 may be a mesh screen. The pores 12 may be formed by machining, or alternatively, if the pores 12 are relatively small, they may be formed by etching. The pore 12 diameter may be as low as 100 microns.

Figure 1B:
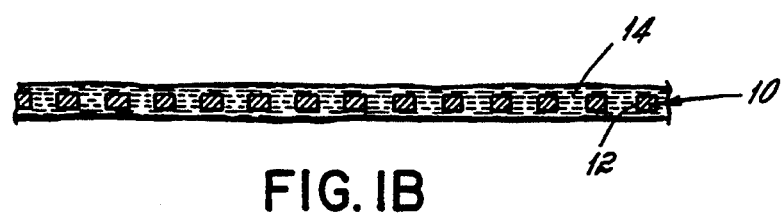

FIG. 1B shows a liquid or melted substance 14 filled within the pores 12 and surrounding opposite sides of the sheet 10. The liquid 14 may be a paint or an adhesive with high or low viscosity and it may include water, oil, organic solvent, or solder, or the liquid may be a melted substance such as paraffin wax, hot melt adhesive, hot melt coating, or solder. Capillary action and/or the viscosity of the liquid 14 keeps it from flowing out of the pores 12. For the remainder of this detailed description of the drawings, and in the claims, the term "liquid" refers to any liquefied flowable substance which may be filled into the pores 12 and then transferred outwardly therefrom by pressure.

Figure 1C:

FIG. 1C depicts the sheet 10 after opposing sides have been wiped, or scraped, of excess liquid 14. This wiping step leaves the liquid 14 only within the pores 12 of the sheet 10. Therefore, if the total volume of the pores 12 is known, the total volume of liquid 14 held by the sheet 10 is also known.

Figure 1D:
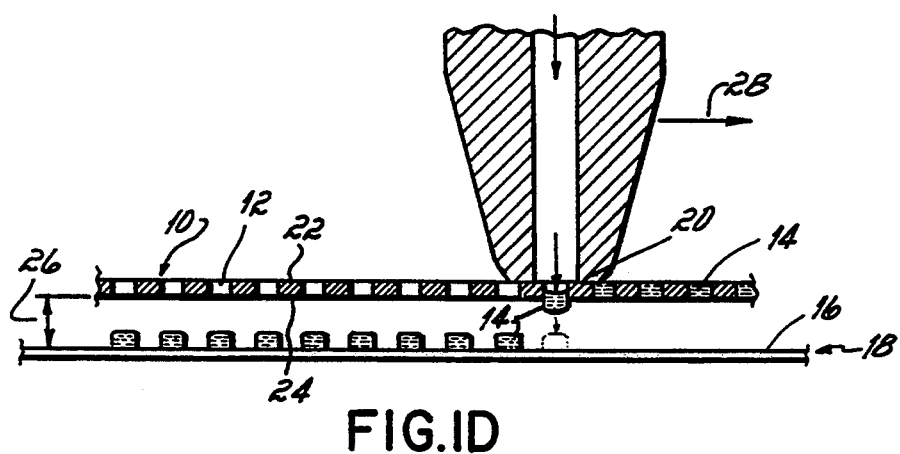

FIG. 1D depicts transfer of the liquid 14 outwardly from the pores 12 and onto a surface 16 of substrate 18. FIG. 1D depicts one preferable method for transferring the liquid 14 from the pores 12 to the surface 16, by blowing pressurized fluid from a nozzle 20 which is relatively close to, and preferably in contact with a first side 22 of the sheet 10 to force the liquid 14 out of the pores 12 and onto the surface 16. Surface 16 is preferably spaced from a second side 24 of the plate 10. The spacing between the second side 24 of the sheet 10 and the surface 16 of substrate 18 is designated by reference numeral 26, and this distance is preferably about an inch (25 mm). If the nozzle 20 is a slit nozzle and the width of the nozzle 20 matches the width of the sheet 10, by moving the nozzle 20 linearly relative to the sheet 10 and the substrate 18, as shown by directional arrow 28, all of liquid 14 from the pores 12 will be transferred. Alternatively, the porous sheet 10 and the substrate 18 may be moved past the nozzle 20.

Figure 1E:

If the liquid 14 has a high degree of stickiness, and the air pressure is relatively low, the liquid 14 will be transferred to surface 16 in single, small droplets or globules with one droplet per pore 12. Thereafter, the attraction among the sprayed particles causes diffusion of the liquid 14 on the surface 16, resulting in a sprayed film of uniform thickness 29 (FIG. 1E). Diffusion can be enhanced by electrostatically charging the liquid 14 prior to spraying, which may be accomplished by using a metal sheet 10 connected to an electrode (not shown).

FIG. 1E shows substantially uniform coating 29 of liquid 14 on the surface 16 of substrate 18, as achieved according to the principles of this invention. If each of the pores 12 is the same size, and the pores 12 are distributed uniformly over the sheet 10, the transferred particles of liquid 14 will be uniformly spaced on the surface 16 (FIG. 1D). The smaller the pores 12 and the denser the distribution of the pores 12, the greater the diffusion effect of the liquid 14 on the surface 16.

By locating the nozzle 20 in contact with the second side 22 of the sheet 10, no compressed gas leakage occurs, and all of the compressed gas is directed through the sheet 10. On the other hand, it is necessary to maintain spacing 26 between second side 24 and substrate 18. Otherwise, sprayed particles would be destroyed. If the distance 26 is too small, the compressed gas directed through the porous sheet 10 would have no place to go, thereby causing random gas flow and resulting in destruction of the particles of liquid 14.

Figure 2:
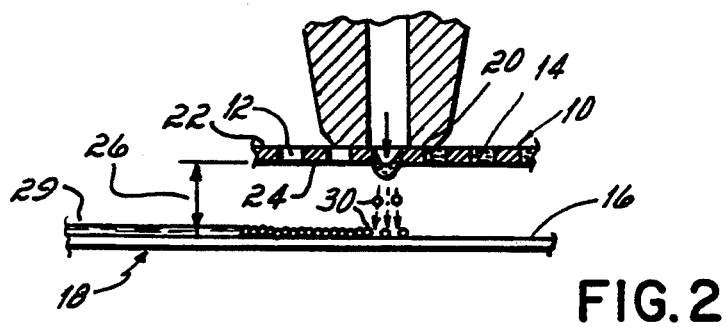
FIG. 2 is a cross-sectional view, similar to FIG. 1D, showing liquid transfer from a porous sheet to a surface wherein spray speed is relatively high and the adhesive character of the liquid is relatively low.

For the above example, it is assumed that every droplet of liquid 14 transferred from a pore 12 to the surface 16 occupied the entire volume of the respective pore 12. This situation is actually limited to applications wherein the liquid 14 is relatively sticky and the speed or force of the compressed fluid from the nozzle 20 is relatively low. FIG. 2 shows an opposite situation, with a liquid 14 of low stickiness and a high spray speed supplied by the nozzle 20. In this case, the liquid 14 from each pore 12 is transferred in the form of relatively small particles 30 which coalesce on the surface 16 to achieve a film of uniform thickness.

The liquid 14 is expelled from the pores 12 by a compressed fluid which may be compressed air, at least one of liquefied gas, a catalyst and a super-critical fluid or a mixture of compressed air and at least one of a liquefied gas, a catalyst and a super critical fluid. Depending on the liquid 14, the catalyst may assist in setting of the liquid 14 on the surface 16 after transfer.

If it is desired to reduce the stickiness of the liquid 14, or to use a melted substance such as wax, heating the compressed fluid supplied by the nozzle 20 is beneficial.

If the liquid 14 is a solution, emulsion or a super-critical fluid, such as a $CO_2$ suspension, which includes a solvent that tends to evaporate, the solvent can be mixed in with the super critical fluid supplied by the nozzle 20. The solvent may assist in complete removal of the liquid 14 from the pores 12. A super critical fluid such as $CO_2$ is advantageous because it disperses relatively easily when exposed to atmospheric pressures. Also, the super critical fluid is soluble to paint, resin, adhesive and organic solvent.

Figure 3:
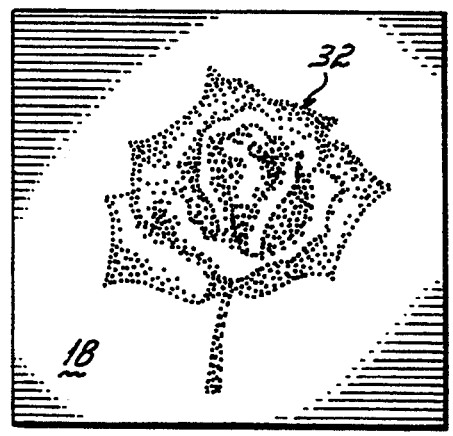
FIG. 3 depicts a plan view of a pattern formed with a porous sheet in accordance with an alternative embodiment of the invention, wherein the size and/or distribution of the pores in the sheet form a recognizable pattern.

FIG. 3 shows a recognizable pattern 32, more particularly a flower, formed on the substrate 18 in accordance with one aspect of the invention. This pattern 32 is achieved by arranging the size and/or distribution density of the pores 12 in the sheet 10 to produce a flower design. Depending upon the pattern selected, this inventive method can be applied to printing because the spraying step always involves spraying a fixed quantity of liquid 14, i.e. an amount equal to the volume of the pores 12. This manner of printing produces a result which is similar to silk screen printing of plates.

For FIG. 1D and FIG. 2, it is assumed that the nozzle 20 has a width equal to the width of the sheet 10, and that one pass of the nozzle 20 expels all of the fluid 14. However, this is not necessary to practice the invention. With a smaller nozzle 20 width, by controlling the flow of compressed air from the nozzle 20 while moving the nozzle 20 relative to the sheet 10 and substrate 18, a recognizable pattern can also be achieved. By using various sized nozzles 20 and porous sheets 10, and by providing computerized control of the nozzle 20 relative to the sheet 10 and the substrate 18 (or movement of the sheet 10 and substrate 18 with respect to a stationary nozzle 20), a high degree of control can be achieved to spray a wide variety of patterns.

Figure 4:
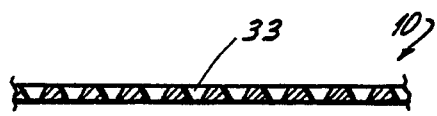
FIG. 4 is a cross-sectional view, similar to FIG. 1A, which depicts a porous sheet with tapered pores.

FIG. 4 shows a sheet 10 with pores 33 which taper in transverse cross section. If it is desired to obtain wider distribution, the larger ends of the pores 33 should be located on the substrate 18 side of the sheet 10. If it is desired to achieve higher definition, for instance for printing, the smaller ends of the pores 33 should be located closest to the substrate 18.

Figure 5:
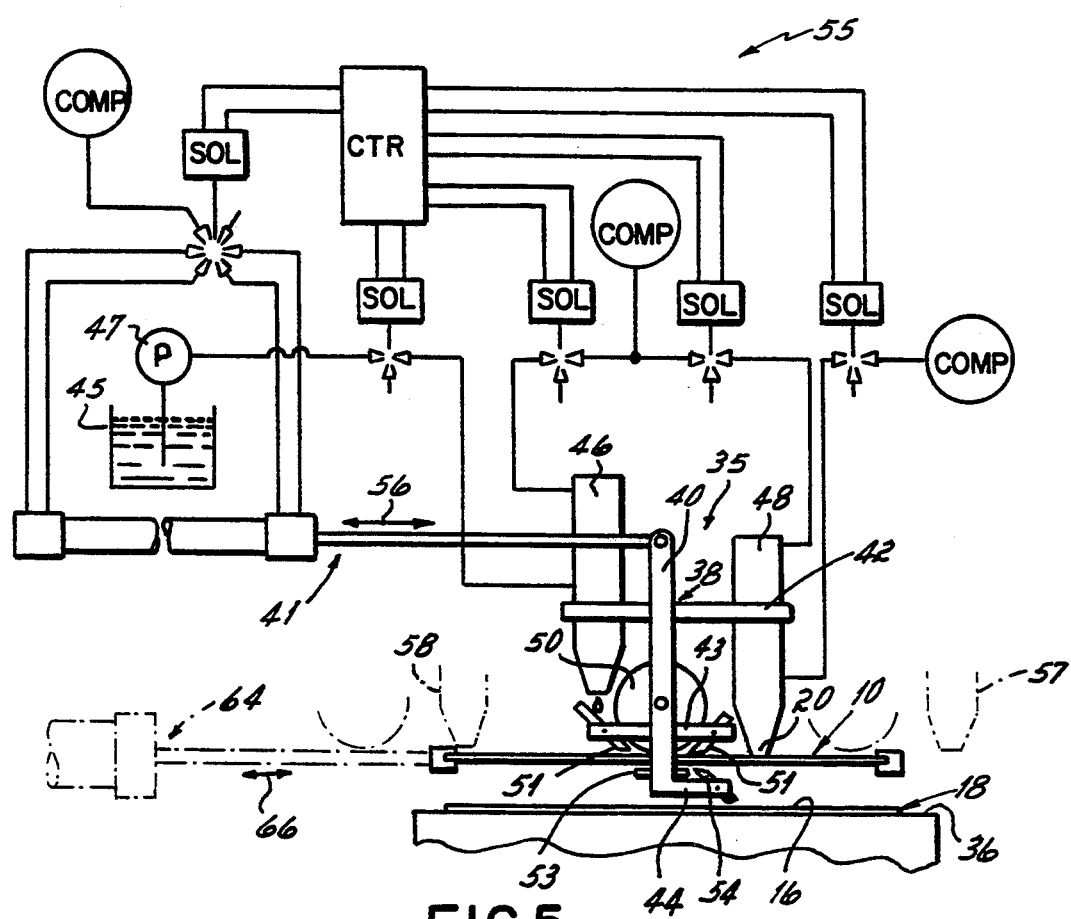
FIG. 5 is a cross-sectional view of a spray apparatus constructed in accordance with a first preferred embodiment of the invention.
Figure 6:
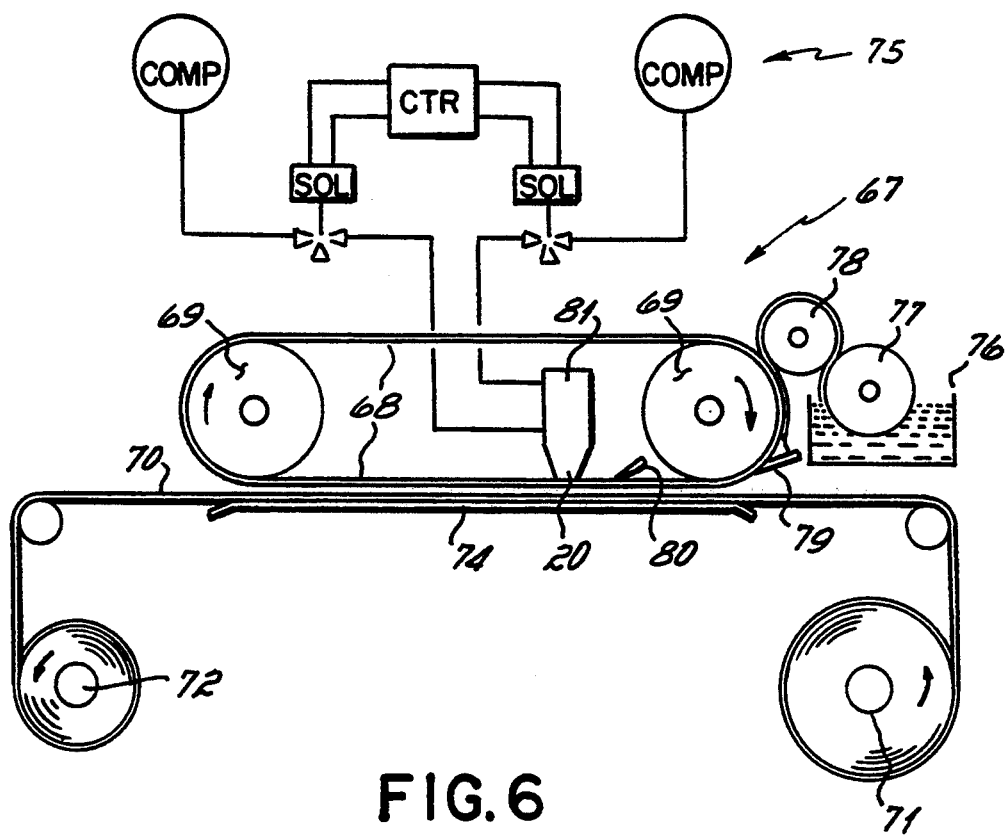
FIG. 6 is a cross-sectional view, similar to FIG. 5, of a spray apparatus constructed in accordance with a second preferred embodiment of the invention.
Figure 7:
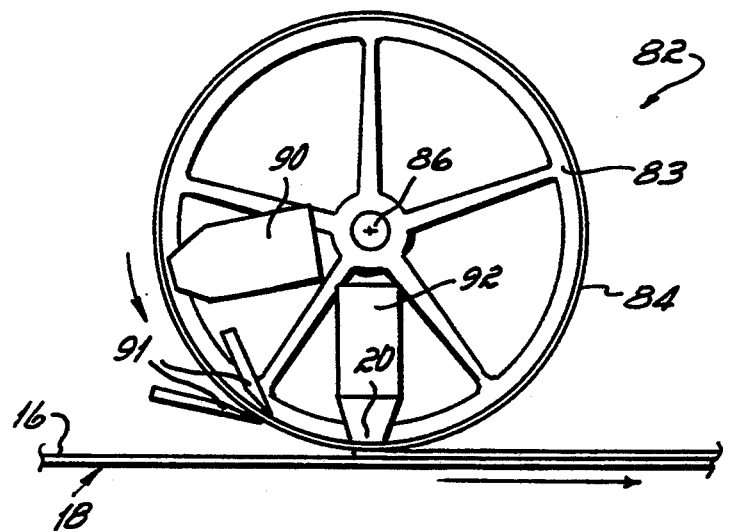
FIG. 7 is a cross-sectional view, similar to FIGS. 5 and 6, which depicts a spray apparatus constructed in accordance with a third embodiment of the invention.

FIG. 5 shows a spray apparatus 35 constructed in accordance with a first preferred embodiment of the invention. In this embodiment, the sheet 10 and the substrate 18 remain parallel with each other, with the substrate 18 supported on a surface 36. In a first variation, the sheet 10 and the substrate 18 remain stationary, while the components which accomplish filling of the pores, wiping of the sheet and transferring the liquid from the pores move linearly with respect to the fixed sheet 10 and substrate 18.

More particularly, this apparatus 35 includes a frame 38 which moves linearly with respect to the sheet 10 and the substrate 18. As shown in FIG. 5, the frame 38 includes a vertical arm 40 which is moved horizontally by a rod of a linear actuator 41. An upper horizontal arm 42, a middle horizontal arm 43 and a lower horizontal arm 44 connect to the vertical arm 40. The upper horizontal arm 42 supports a liquid supply canister 46 and a nozzle assembly 48. Liquid 14 is pumped to canister 46 from a reservoir 45 by a pump 47. A roller 50 rotatably connects to the vertical arm 40 between the upper horizontal arm 42 and the middle horizontal arm 43. The middle horizontal arm 43 supports upper scrapers 51 on opposite sides of the roller 50, above the sheet 10. A drip pan 53 connects to the vertical arm 40 below the sheet 10. Preferably a lower scraper 54 is supported by the lower horizontal arm 44 directly below one of the upper scrapers 51. Reference numeral 55 generally designates the components which control the operation of apparatus 35.

The frame 38 moves linearly with respect to sheet 10 and substrate 18 in reciprocal motion, as shown by directional arrow 56. Phantom outlines 57 and 58 show the beginning and the end points, respectively, of the nozzle assembly 48.

With the frame 38 moved to its furthest position on the right, as viewed in FIG. 5, liquid 14 from the supply canister 46 is directed toward the top of the sheet 10 by the upper scrapers 51, and the liquid 14 is spread thereon by the roller 50. As the frame 38 moves to the left, the upper scraper 51 and the lower scraper 54 located between supply canister 46 and the nozzle assembly 48 wipe the excess liquid 14 off of the top and bottom surfaces of the sheet 10, respectively. Thereafter, the nozzle 20 located at the bottom end of the nozzle assembly 48 directs a stream of compressed air against the top surface of the sheet 10 to spray the liquid 14 outwardly from the pores 12 onto the top surface 16 of substrate 18.

According to a variation of this embodiment, the frame 38 may remain stationary, while the sheet 10 and the substrate 18 are moved linearly with respect thereto. FIG. 5 includes a piston 64 shown in phantom, with directional arrow 66 indicating reciprocal linear movement of the sheet and the substrate 18 with respect to the frame 38. In this variation, though not shown, surface 36 would also move with sheet 10.

FIG. 6 shows a liquid spray apparatus 67 constructed in accordance with a second preferred embodiment of the invention. According to this embodiment, the porous sheet 10 comprises an endless belt conveyor 68 mounted on a pair of spaced wheels 69. The substrate 18 comprises a continuous web 70 wound on a supply of roll 71 and a feed roll 72. A guide 74 supports the bottom of the web 70 during movement thereof. Reference numeral 75 generally designates the components which control the operation of apparatus 67.

The components for filling the pores 12 of the belt 68, wiping excess liquid 14 from the belt 68 and spraying the liquid 14 outwardly from the pores 12 remain stationary with respect to the movable belt 68 and the movable web 70. Liquid container 76 contains liquid 14 to be sprayed. During clockwise movement of the conveyor 68, rotation of liquid supply rolls 77 and 78 about their respective axes causes the liquid 14 from container 76 to fill the pores 12 of the belt 68. An outer scraper 79 and an inner scraper 80 wipe excess liquid 14 from the bottom and the top surfaces, respectively, of the belt 68. Pressurized air supplied to a nozzle assembly 81 enables the nozzle 20 to spray the liquid 14 out of the pores 12 of the belt 68 toward the web 70, while the belt 68 and the web 70 move with respect to the nozzle 20.

If desired, the belt 68 and the web 70 may be moved at different speeds to control the density of the sprayed liquid 14. For instance, if the belt 68 is moved faster than the web 70, a thicker coating of liquid 14 will be obtained. If the belt 68 is moved slower than the web 70, a thinner coating of liquid 14 will be obtained. To spray liquid 14 as particles or as a fine grain, with a high speed for the web 70, the speed difference between the conveyor 68 and the web 70 should be less than 5 meters/-minute.

FIG. 7 depicts a spray apparatus 82 constructed in accordance with a third preferred embodiment of the invention. In this embodiment, the porous sheet 10 is supported on the outside of a cylindrical frame 83 to form a cylinder 84 which is rotatable about an axis 86. In this embodiment, the substrate 18 moves tangentially with respect to the cylinder 84. A liquid dispenser 90 and a nozzle assembly 92 maintain fixed positions with respect to the rotatable cylinder 84.

While the cylinder 84 rotates counterclockwise about axis 86 and the substrate 18 moves tangentially with respect to the cylinder 84, (from left to right, as viewed in FIG. 7) the liquid supply container 90 packs liquid 14 into the pores 12 of the cylinder 84. Further rotation of the cylinder 84 causes this packed liquid to be wiped from the inner and outer sides of the sheet 10 by scrapers 91. Further rotation of the cylinder 84 in the same direction moves the liquid-filled pores 12 of the cylinder 84 into alignment with the nozzle 20 of the nozzle assembly 92, thereby causing the liquid 14 to be sprayed out of the pores 12 and onto the moving substrate 18.

EXAMPLE ONE

In one experimental example utilizing this inventive method, a paraffin wax, i.e. a melted substance, with a melting point of 125° F. was used as the liquid 14. The sheet 10 was a metal sheet having a thickness of about 100 microns, and compressed gas was supplied to the nozzle 20 at a pressure of 3.0 kg/cm$^2$ and at a temperature of 80° C. The liquid 14 was expelled from the pores 12 in the form of particles with a diameter of about 20–30 microns. The resulting film spread obtained was (0.5 mg$\pm$0.02) mg/dm$^2$.

EXAMPLE TWO

In a second experimental example, paraffin wax with a melting point of 125° F. was again used as the liquid 14. The porous sheet 10 had a thickness of 100 microns, with etched pores 12 having a diameter of 100 microns. Using a compressed fluid of liquefied carbon dioxide (super critical condition) at a pressure of 80 kg/cm$^2$ and a temperature of 60° C., the liquid 14 was expelled from the pores 12 in the form of particles having a diameter of about 5 to 12 microns. The resulting film spread was (0.5 mg±0.02) mg/dm².

For both examples, an aluminum foil sheet with dimemsions of 10 cm×10 cm served as the substrate 18. The film spread on the aluminum sheet 18 was obtained by weighing the sheet with a scale sold by Chyo Keiryoki Co. Ltd. as Model No. Jupiter C3-200MDM and by viewing the particle dispersion on the sheet 18 with a microscope having a magnification of (X1000).

The invention in its broader aspects is therefore not limited to the specific details, representative apparatus and methods, and illustrative examples shown and described. Accordingly, departures may be made from such details without departing from the spirit or scope of applicant's general inventive concept.

What is claimed is:

1. A spraying apparatus comprising:
   a sheet having first and second sides and a plurality of pores formed therethrough;
   means for filling the pores with a liquid;
   means for removing excess liquid from the first and second sides of the sheet;
   nozzle means directed at the first side of the sheet and adapted to supply pressurized fluid to the sheet to spray the liquid from the pores onto the top surface of a substrate spaced from the second side of the sheet, the sheet not being in contact with the substrate, wherein the filling means, the removing means and the nozzle means are mounted to a frame; and
   means for linearly moving, relative to the sheet and the substrate, the frame and the filling means, the removing means and the nozzle means mounted thereto.

2. A spraying apparatus comprising:
   a sheet having first and second sides and a plurality of pores formed therethrough;
   means for filling the pores with a liquid;
   means for removing excess liquid from the first and second sides of the sheet;
   nozzle means directed at the first side of the sheet and adapted to supply pressurized fluid to the sheet to spray the liquid from the pores onto the top surface of a substrate spaced from the second side of the sheet, the sheet not being in contact with the substrate, wherein the filling means, the removing means and the nozzle means are mounted to a frame; and
   means for linearly moving the sheet and substrate relative to the frame and the filling means, the removing means and the nozzle means mounted thereto.

3. A spraying apparatus comprising:
   a sheet having first and second sides and a plurality of pores formed therethrough;
   means for filling the pores with a liquid;
   means for removing excess liquid from the first and second sides of the sheet;.
   nozzle means directed at the first side of the sheet and adapted to supply pressurized fluid to the sheet to spray the liquid from the pores onto the top surface of a substrate spaced from the second side of the sheet, the sheet not being in contact with the substrate, wherein the filling means, the removing means and the nozzle means are stationary, the sheet comprises an endless belt and further comprising:
   conveyor means for continuously conveying the sheet past each of the filling means, the removing means and the nozzle means; and
   substrate conveying means for moving the substrate past the nozzle means in spaced relation with the sheet.

4. A spraying apparatus comprising:
   a sheet having first and second sides and a plurality of pores formed therethrough;
   means for filling the pores with a liquid;
   means for removing excess liquid from the first and second sides of the sheet;
   nozzle means directed at the first side of the sheet and adapted to supply pressurized fluid to the sheet to spray the liquid from the pores onto the top surface of a substrate spaced from the second side of the sheet, the sheet not being in contact with the substrate, wherein the sheet is cylindrical in shape and encloses the filling means, the removing means and the nozzle means, and further comprising:
   means for rotating the cylindrically shaped sheet past the filling means, the removing means and the nozzle means; and
   means for moving the substrate in a direction tangential to the cylindrical sheet during rotation of the sheet, thereby to spray coat the liquid on the tangentially moving substrate.

* * * * *